US008623716B2

(12) United States Patent
Wang et al.

(10) Patent No.: US 8,623,716 B2
(45) Date of Patent: Jan. 7, 2014

(54) MULTI-GATE SEMICONDUCTOR DEVICES AND METHODS OF FORMING THE SAME

(75) Inventors: Chih-Ching Wang, Jinhu Township, Kinmen County (TW); Jon-Hsu Ho, New Taipei (TW); Ching-Fang Huang, Taipei (TW); Wen-Hsing Hsieh, Taichung (TW); Tsung-Hsing Yu, Taipei (TW); Yi-Ming Sheu, Hsinchu (TW); Ken-Ichi Goto, Hsin-Chu (TW); Zhiqiang Wu, Chubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 41 days.

(21) Appl. No.: 13/288,047

(22) Filed: Nov. 3, 2011

(65) Prior Publication Data

US 2013/0113042 A1    May 9, 2013

(51) Int. Cl.
*H01L 21/00* (2006.01)
*H01L 21/338* (2006.01)
*H01L 21/336* (2006.01)
*H01L 21/3205* (2006.01)

(52) U.S. Cl.
USPC ........... 438/157; 438/283; 438/176; 438/587; 438/268

(58) Field of Classification Search
None
See application file for complete search history.

(56) References Cited

U.S. PATENT DOCUMENTS

| 5,837,601 | A * | 11/1998 | Matsumoto | 438/592 |
| 6,989,308 | B2 * | 1/2006 | Furukawa et al. | 438/283 |
| 2002/0011612 | A1 | 1/2002 | Hieda | |
| 2002/0102796 | A1 * | 8/2002 | Lee et al. | 438/283 |
| 2004/0256683 | A1 | 12/2004 | Lee et al. | |
| 2005/0019993 | A1 * | 1/2005 | Lee et al. | 438/157 |
| 2006/0094194 | A1 | 5/2006 | Chen et al. | |
| 2007/0218628 | A1 * | 9/2007 | Orlowski et al. | 438/254 |
| 2009/0184369 | A1 | 7/2009 | Zhu | |
| 2009/0309167 | A1 | 12/2009 | Russ et al. | |
| 2010/0190308 | A1 * | 7/2010 | Orlowski et al. | 438/275 |
| 2011/0042748 | A1 | 2/2011 | Anderson et al. | |

* cited by examiner

*Primary Examiner* — Julio J Maldonado
*Assistant Examiner* — Harpreet Singh
(74) *Attorney, Agent, or Firm* — Duane Morris LLP; Christopher J. Tyson

(57) ABSTRACT

A multi-gate semiconductor device and method for forming the same. A multi-gate semiconductor device is formed including a first fin of a first transistor formed on a semiconductor substrate having a first dopant type. The first transistor has a doped channel region of the first dopant type. The device also includes a second fin of a second transistor formed on the first dopant type semiconductor substrate. The second transistor has a doped channel region of a second dopant type. The device further includes a gate electrode layer of the second dopant type formed over the channel region of the first fin and a gate electrode layer of the first dopant type formed over the channel region of the second fin.

20 Claims, 10 Drawing Sheets

MULTI-GATE SEMICONDUCTOR DEVICES AND METHODS OF FORMING THE SAME

FIELD OF THE INVENTION

The present disclosure is directed generally to multi-gate semiconductor devices and more particularly to FinFETs and methods of forming the same.

DESCRIPTION OF THE RELATED ART

Multi-gate semiconductor devices, such as FinFETs, are being considered for many logic and other applications in the semiconductor manufacturing industry and are integrated into various different types of semiconductor devices. In FinFETs, gates are typically formed over and along the sides of semiconductor fins and take advantage of the increased surface area of the channel and source/drain regions formed in the fins to produce faster, more reliable and better controlled semiconductor transistor devices.

Multi-gate semiconductor devices having multiple voltage threshold (VT) transistors are conventionally formed within a single semiconductor device. While fabricating multi-VT devices, transistors having higher voltage thresholds have shown degraded performance and mobility due to the higher dopant concentrations typically utilized in the channel regions of such devices.

BRIEF DESCRIPTION OF THE DRAWINGS

Various aspects of the present disclosure will be or become apparent to one with skill in the art by reference to the following detailed description when considered in connection with the accompanying exemplary non-limiting embodiments.

DETAILED DESCRIPTION OF THE EXAMPLES

Figure 1:
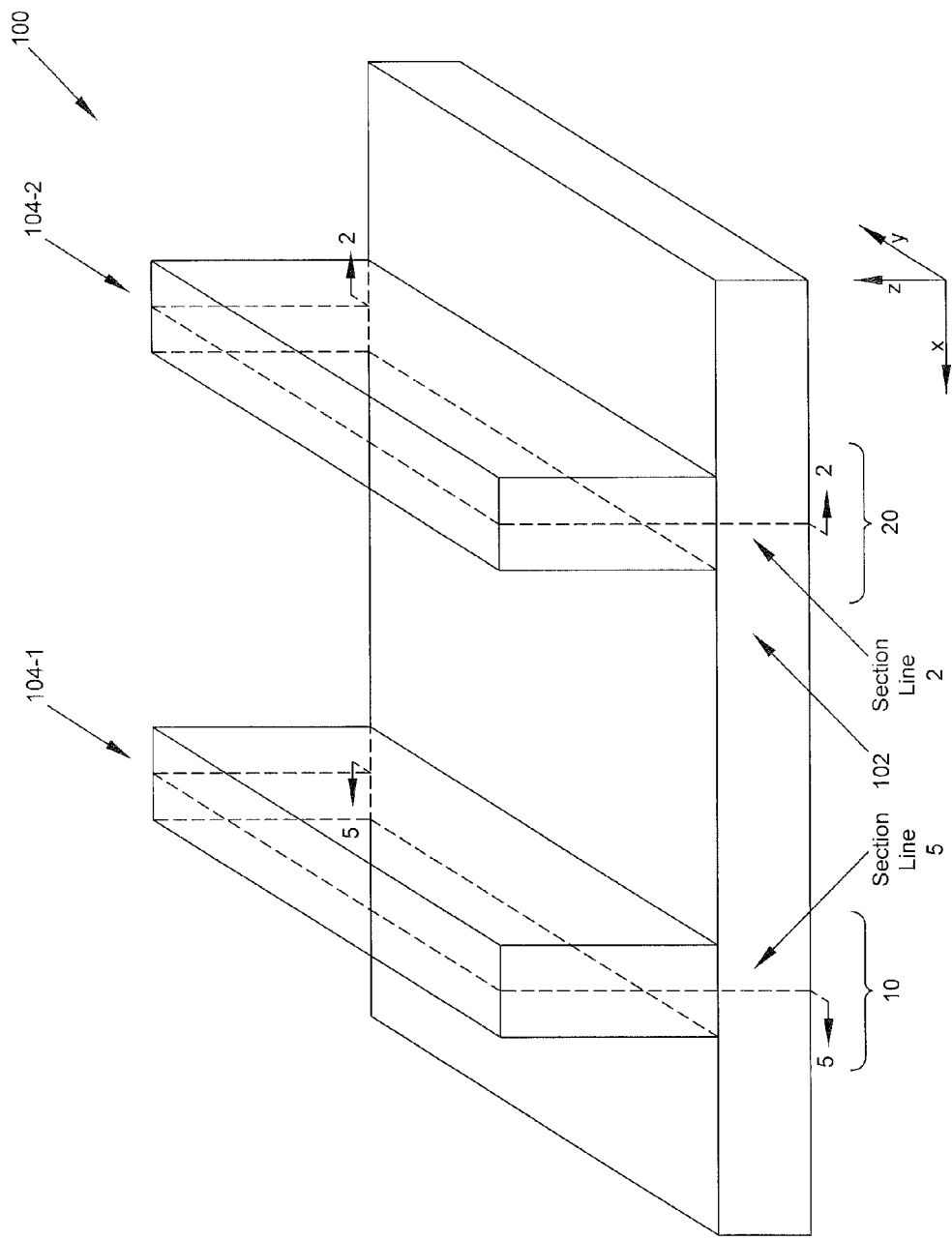
FIG. 1 illustrates an isometric view of a semiconductor device showing different cross-section directions for FIGS. 2 and 5.

An improved multi-gate semiconductor device is described below, with improved device performance for single work function and dual work function multi-voltage threshold (VT) devices. The multi-gate semiconductor device fabrication processes described herein may be performed using any suitable commercially available equipment commonly used in the art to manufacture multi-gate semiconductor devices, or alternatively, using future developed equipment.

Multi-voltage threshold (VT) devices have been observed to control channel-concentration to permit the incorporation of multi-VT devices at a single substrate. However, doping concentration in multi-voltage threshold (VT) devices directly affect a VT device's mobility and performance. The inventors have observed that, for a multi-VT device, optimization of work function metal is an effective mechanism to improve metal-oxide semiconductor (MOS) transistor performance especially in VT devices with higher voltage thresholds and that also minimizes the cost and impact on subsequent processing steps.

With reference to the Figures, where like elements have been given like numerical designations to facilitate an understanding of the drawings, the various embodiments of a multi-gate semiconductor device and methods of forming the same are described. The figures are not drawn to scale.

The following description is provided as an enabling teaching of a representative set of examples. Those skilled in the art will recognize that many changes can be made to the embodiments described herein while still obtaining beneficial results. It will also be apparent that some of the desired benefits discussed below can be obtained by selecting some of the features or steps discussed herein without utilizing other features or steps. Accordingly, those who work in the art will recognize that many modifications and adaptations, as well as subsets of the features and steps described herein are possible and may even be desirable in certain circumstances. Thus, the following description is provided as illustrative and is not limiting.

This description of illustrative embodiments is intended to be read in connection with the accompanying drawings, which are to be considered part of the entire written description. In the description of embodiments disclosed herein, any reference to direction or orientation is merely intended for convenience of description and is not intended in any way to limit the scope of the present invention. Relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation. Terms such as "attached," "affixed," "connected" and "interconnected," refer to a relationship wherein structures are secured or attached to one another either directly or indirectly through intervening structures, as well as both movable or rigid attachments or relationships, unless expressly described otherwise. The term "adjacent" as used herein to describe the relationship between structures/components includes both direct contact between the respective structures/components referenced and the presence of other intervening structures/components between respective structures/components. Moreover, various features and benefits are illustrated by reference to the exemplary embodiments. Accordingly, the subject matter of this disclosure and the appended claims are expressly not limited to such preferred embodiments.

As used herein, use of a singular article such as "a," "an" and "the" is not intended to exclude pluralities of the article's object unless the context clearly and unambiguously dictates otherwise.

Figure 2:
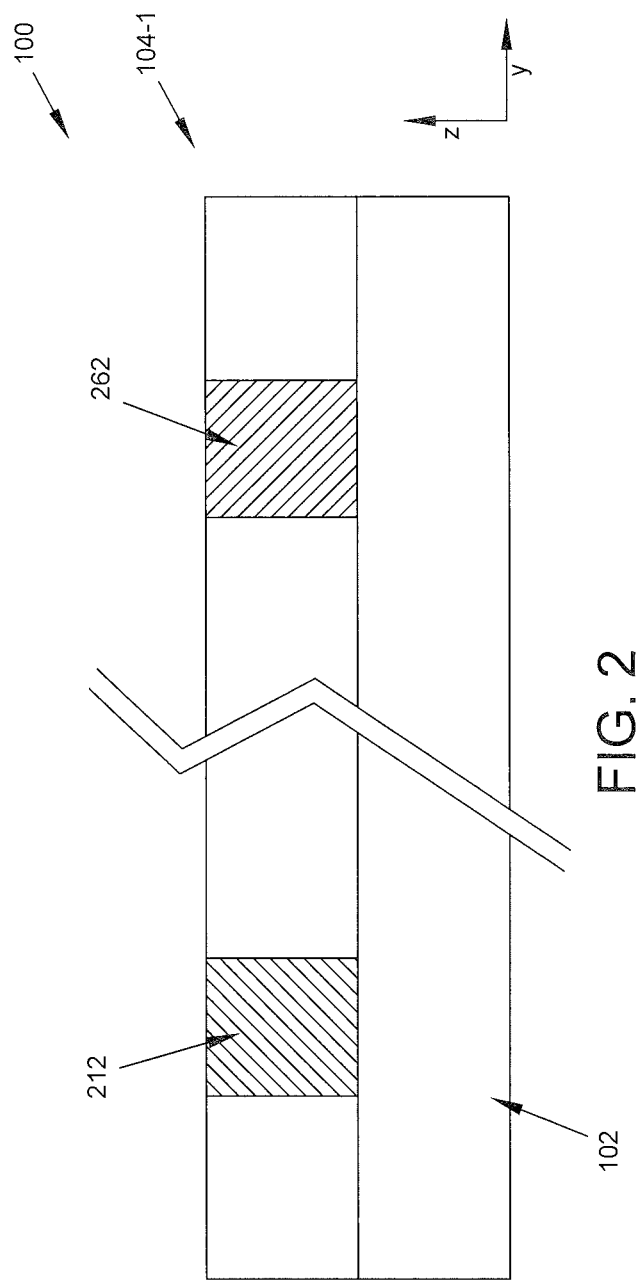
FIG. 2 is a cross-sectional view of a semiconductor device according to an embodiment.
Figure 5:
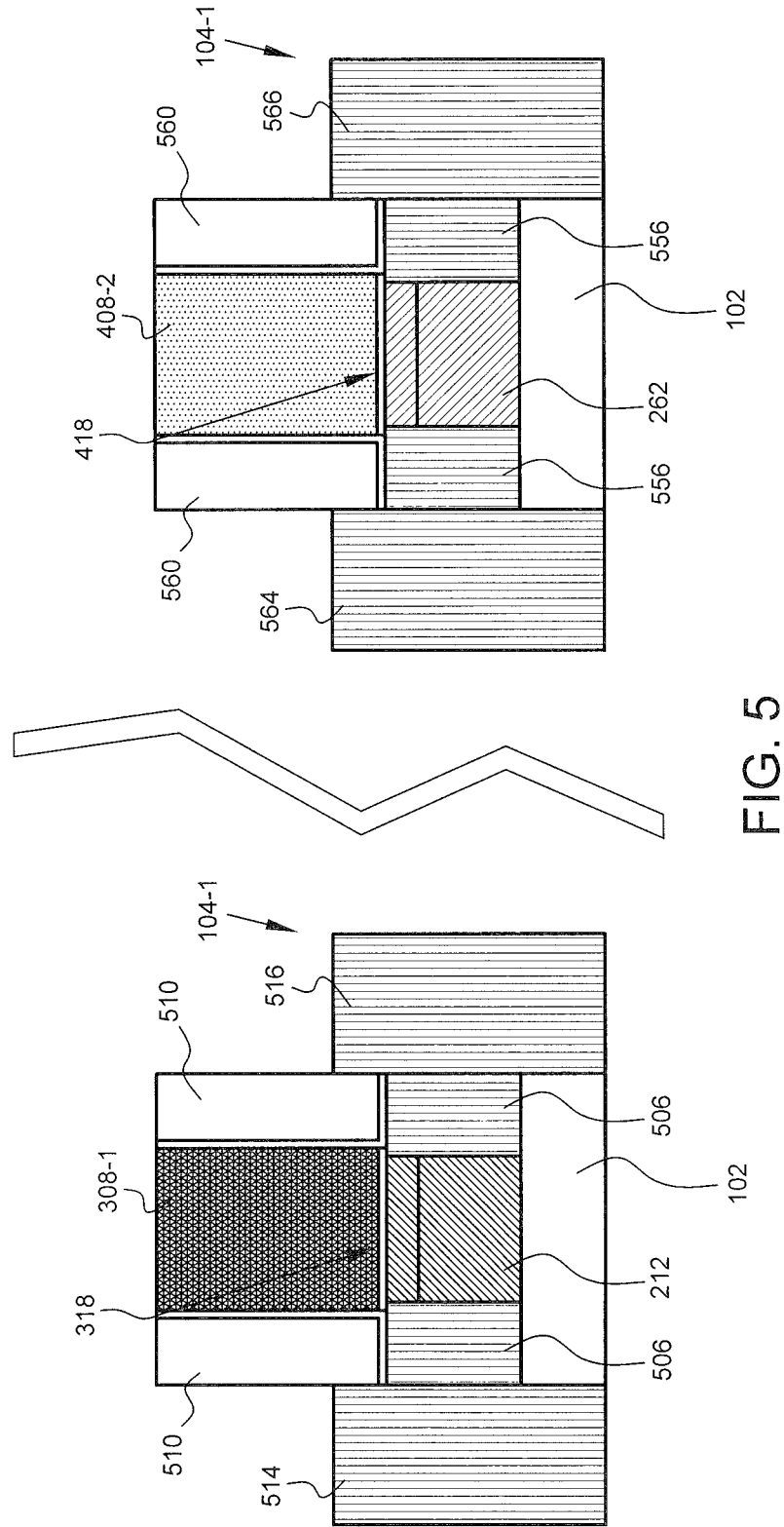
FIG. 5 is a cross-sectional view of a multi-gate semiconductor device according to an embodiment.

With reference now to FIG. 1, an isometric view schematic of the formation of a multigate device structure is illustrated showing different cross-section directions for FIGS. 2 and 5. In FIG. 1, the multigate device structure includes a semiconductor substrate 102, which may be part of an integrated circuit (IC) die, either singulated, or as a part of a wafer 100. Semiconductor substrate 102 may be a bulk silicon substrate, a bulk silicon germanium (SiGe) substrate, a Group III-V compound substrate, or a substrate formed of other suitable materials. Substrate 102 may be doped with a p-type or an n-type impurity. Isolation regions, such as shallow trench isolation (STI) regions (not shown) may be formed in or over substrate 102. Semiconductor fins 104-1 and 104-2 are formed extending above the substrate 102. In some embodiments, fins 104-1 and 104-2 are formed above a top surface of the STI regions (not shown). Substrate 102 includes a portion formed in NMOS region 10 and a portion formed in PMOS region 20. As shown, Fins 104-1 and 104-2 are formed in NMOS region 10 and PMOS region 20 respectively.

Semiconductor fins 104-1 and 104-2 may be formed by any suitable method. In some embodiments, semiconductor fins 104-1 and 104-2 may be formed by forming STI regions (not shown) first, and then recessing the top surface of STI regions (not shown) to a level lower than the original top surface of substrate 20. The remaining portions of substrate 102 between STI regions (now shown) thus become fins 104-1 and 104-2. For example, substrate 102 may be patterned and etched through a photolithographic process. In some embodiments, semiconductor fins 104-1 and 104-2 are formed from a material different from that of substrate 102. Fins 104-1 and 104-2 can be formed by recessing top portions of substrate 102 between neighboring STI regions (not shown) to form recesses, and re-growing a semiconductor material different from that of substrate 102 in the recesses. Top portions of STI regions (not shown) may then be removed, while bottom portions of STI regions (not shown) are not removed, so that the top portions of the re-grown semiconductor material between neighboring STI regions (not shown) become semiconductor fins. In another embodiment, STI regions (not shown) may be formed by a process including recess formation on substrate 102, forming a dielectric film using a chemical vapor deposition (CVD) process, then using chemical metal polishing (CMP) to remove extra STI dielectric film. Fins 104-1 and 104-2 may then be formed and patterned through an epitaxial growth process.

Semiconductor fins 104-1 and 104-2 have a respective channel region formed therein. The respective channel region may be formed from any suitable material including, but not limited to Ge, SiGe or a III-V semiconductor material, Semiconductor fins 104-1 and 104-2 have channel region dopants introduced by any suitable method. For example, channel region dopants may be introduced through implantations, or through in-situ doping performed simultaneously with the growth of semiconductor fins 104-1 and 104-2. The inventors have discovered that by selecting the gate electrode material and channel doping material, an optimum work-function gate material in a multi-VT device can be achieved to improve VT MOS transistor performance and mobility.

FIG. 2 is a cross-sectional view of a substrate 102 and portions of fin 104-1 taken along the section line 2 of FIG. 1. As shown, p-type dopants are introduced into channel region 212 at a first portion of fin 104-1. Any suitable p-type dopant may be introduced. For example, a p-type impurity such as boron may be implanted into channel region 212. In some embodiments, channel region 212 may be doped at a concentration between approximately $-2e^{18}$ and $1e^{18}$ charge carriers per cubic centimeter (e.g. between $-2.1e^{18}$ and $1.05e^{18}$ charge carriers per cubic centimeter.) Referring back to FIG. 2, n-type dopants are introduced into channel region 262 at a second portion of fin 104-1. Any suitable n-type dopant may be introduced. For example, a n-type impurity such as arsenic or phosphorous may be implanted into channel region 262. In some embodiments, channel region 262 may be doped at a concentration between approximately $-2e^{18}$ and $1e^{18}$ charge carriers per cubic centimeter (e.g. between $-2.1e^{18}$ and $1.05e^{18}$ charge carriers per cubic centimeter.) In another embodiment, the doping is reversed such that channel region 212 is n-type doped and channel region 262 is p-type doped. Fin 104-2 may include similar channel regions formed at similar fin portions as described and shown for fin 104-1 at FIG. 2.

Figure 3:
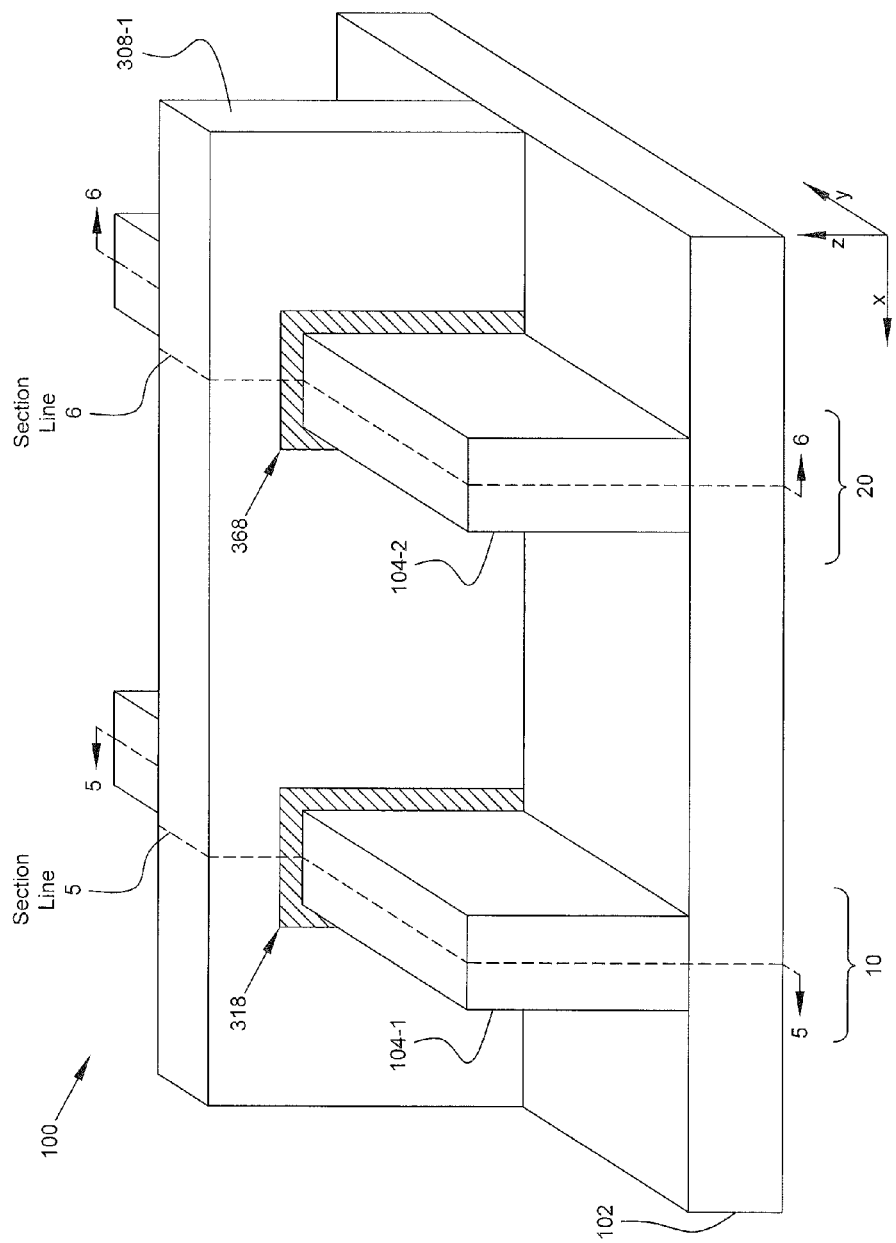
FIG. 3 illustrates an isometric view of a multi-gate semiconductor device showing different cross-section directions for FIGS. 5 and 6.
Figure 6:
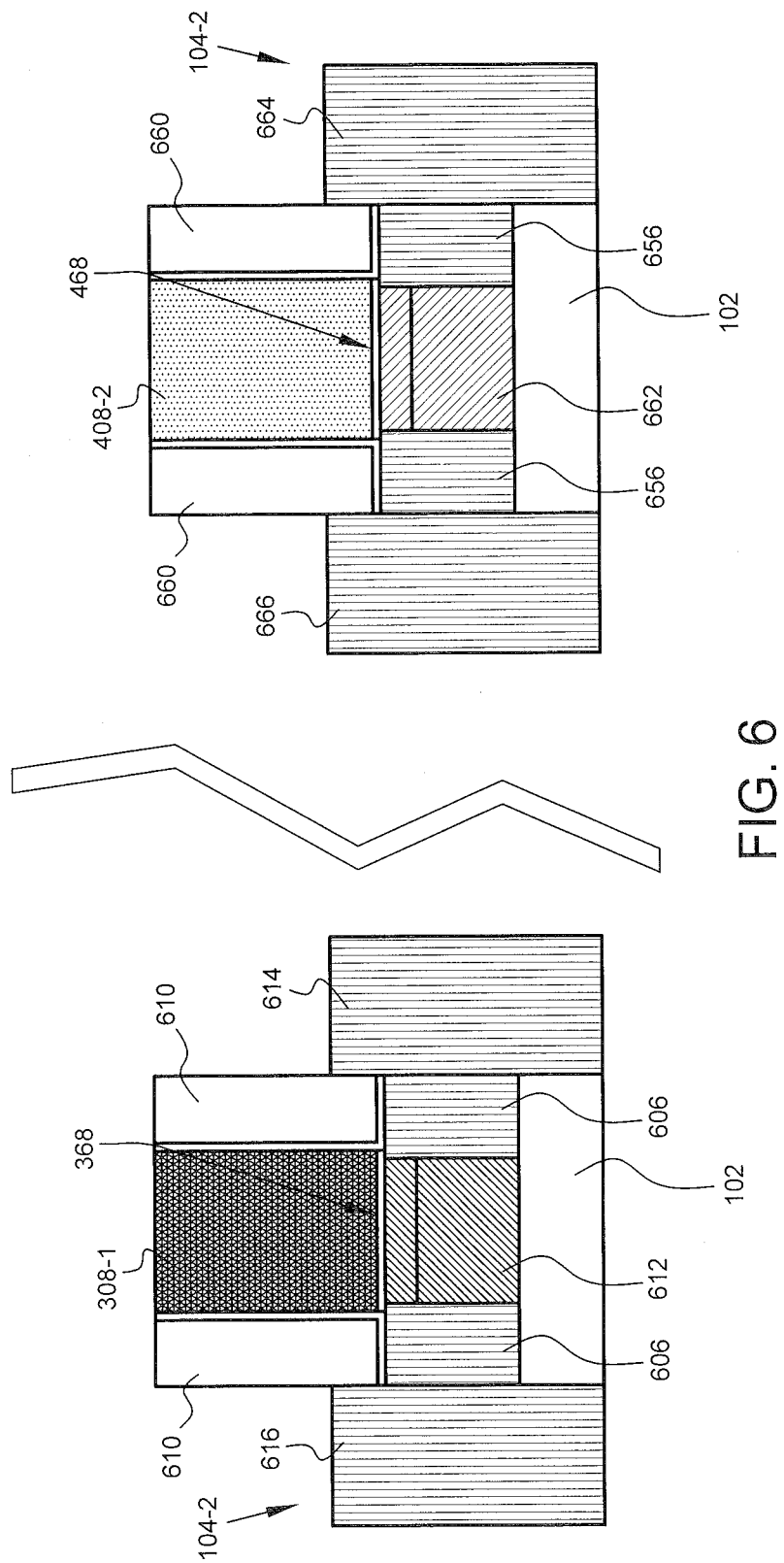
FIG. 6 is a cross-sectional view of a multi-gate semiconductor device according to an embodiment of the present disclosure.

FIG. 3 shows an isometric view of the formation of a multigate device structure and illustrates a cross-section direction for FIGS. 5 and 6. In FIG. 3, the multigate device structure includes a FinFET 100, which further includes a semiconductor substrate 102. Gate electrode layer 308-1 is deposited in both N-type diffusion region 10 and P-type diffusion region 20 and over semiconductor fin 104-1 and semiconductor fin 104-2. In some embodiments, gate electrode layer 308-1 may be deposited over channel region 262 (FIG. 2) and channel region 662 (FIG. 6). Gate electrode layer 308-1 may be formed by any suitable method including, for example, PVD ("physical vapor deposition"), CVD ("chemical vapor deposition"), or ALD ("atomic layer deposition"). CVD and ALD may use an organometallic or halide precursor, and a reducing atmosphere. Isolation regions, such as STI regions (not shown) may be formed in or over substrate 102 and between fins 104-1 and 104-2.

As identified above, by selecting the gate electrode material suitable for the dopant materials for the respective channel regions of each of the transistors of a multi-gate semiconductor device, improved voltage threshold (VT) MOS transistor performance and mobility can be realized. The inventors have discovered that for a multi-gate semiconductor device, such as a FinFET, low doping concentrations can be maintained in transistors having different voltage thresholds which will improve the transistors' performance and mobility. In some embodiments, channel region dopant concentrations can be maintained between approximately $-2e^{18}$ and $1e^{18}$ charge carriers per cubic centimeter (e.g. between $-2.1e^{18}$ and $1.05e^{18}$ charge carriers per cubic centimeter.) By way of example, such improvements have been observed in high VT transistors (HVT) with voltage thresholds between approximately 0.5 and 0.9V (e.g. 0.45-0.95V) and in standard VT transistors (SVT) between approximately 0.1V and 0.4V (e.g. 0.05-0.45V). In several embodiments, the improved transistor performance and mobility that has been observed includes a significant reduction in the work function difference between transistors having different voltage thresholds in multi-VT devices such as FinFETs. In some embodiments, gate dielectric layer 318 (368) may be deposited in N region 10 and P region 20 respectively and over semiconductor fins 104-1 and 104-2. In some embodiments, gate dielectric layer 318 (368) is formed of a dielectric material. The dielectric material may include aluminum-containing dielectrics, such as $Al_2O_3$, HfAlO, HfAlON, AlZrO, Hf-containing materials, such as $HfO_2$, $HfSiO_x$, $HfAlO_x$, $HfZrSiO_x$, HfSiON, other materials such as $LaAlO_3$ and $ZrO_2$ and/or any other suitable material. Gate dielectric layer 318 (368) may be formed by any suitable method. In the illustrated embodiment, gate electrode layer 308-1 is formed on gate dielectric layer 318 (468) in both N region 10 and P region 20 and over semiconductor fins 104-1 and 104-2. In some embodiments, gate electrode layer 308-1 may be deposited over channel region 262 (FIG. 2) and channel region 662 (FIG. 6). In another embodiment, gate electrode layer 308-1 and gate dielectric layer 318 (368) may be patterned to form gate stacks (not shown) over semiconductor fins 104-1 and 104-2. Each of semiconductor fins 104-1 and 104-2 may have fin portions that are uncovered by the gate stacks (not shown). In some embodiments, dopants may be introduced into the exposed portions of semiconductor fins 104-1 and 104-2 to form doped source and drain regions.

In some embodiments where the dopants introduced into channel regions 212, 662 (FIG. 6) are n-type dopants, gate electrode layer 308-1 may be formed from any suitable p-type metal including, but not limited to, Ru ("ruthenium"), Pd ("palladium"), Pt ("Platinum"), Co ("cobalt"), Ni ("nickel"), TiAlN ("titanium aluminum nitride"), or WCN ("tungsten carbon nitride"). In another embodiment, where the dopants introduced into channel regions 262, 662 (FIG. 6) are p-type dopants, gate electrode layer 308-1 may be formed from any suitable n-type metal including, but not limited to, Hf, Zr, Ti, Ta, or Al. In some embodiments, the illustrated multigate device structure includes an NMOS transistor including a first fin portion 104-1, p-type doped channel region 262, gate dielectric layer 318 and n-type metal gate electrode layer 308-1. The illustrated multigate device structure may further include a PMOS transistor including a second fin portion 104-2, p-type doped channel region 662 (FIG. 6), gate dielectric layer 468 and n-type metal gate electrode layer 308-1. In some embodiments, the NMOS transistor and PMOS transistor have respective first and second voltage thresholds (VT). The first VT may be higher than the second VT. For example, the first-VT may be approximately between 0.5 and 0.8V (e.g. 0.45 to 0.85V) such that the NMOS transistor has a high VT. The second VT may be approximately between −0.1 and 0.1V (e.g. −0.15V to 0.15V) such that the PMOS transistor has a low VT. In another embodiment, the illustrated multigate device structure may include an NMOS transistor including a first fin portion 104-1, n-type doped channel region 262, gate dielectric layer 318 and p-type metal gate electrode layer 308-1. The illustrated multigate device structure may further include a PMOS transistor including a second fin portion 104-2, n-type doped channel region 662 (FIG. 6), gate dielectric layer 468 and p-type metal gate electrode layer 308-1. In an exemplary embodiment, the work function difference between an NMOS transistor and a PMOS transistor in the illustrated multigate device structure is approximately 200 millielectron volts (meV) or less (e.g. less than 210 meV). In some embodiments, the work function difference between an NMOS transistor and a PMOS transistor in the illustrated multigate device structure is between approximately 100 meV and 200 meV (e.g. 95-210 meV).

Figure 4:
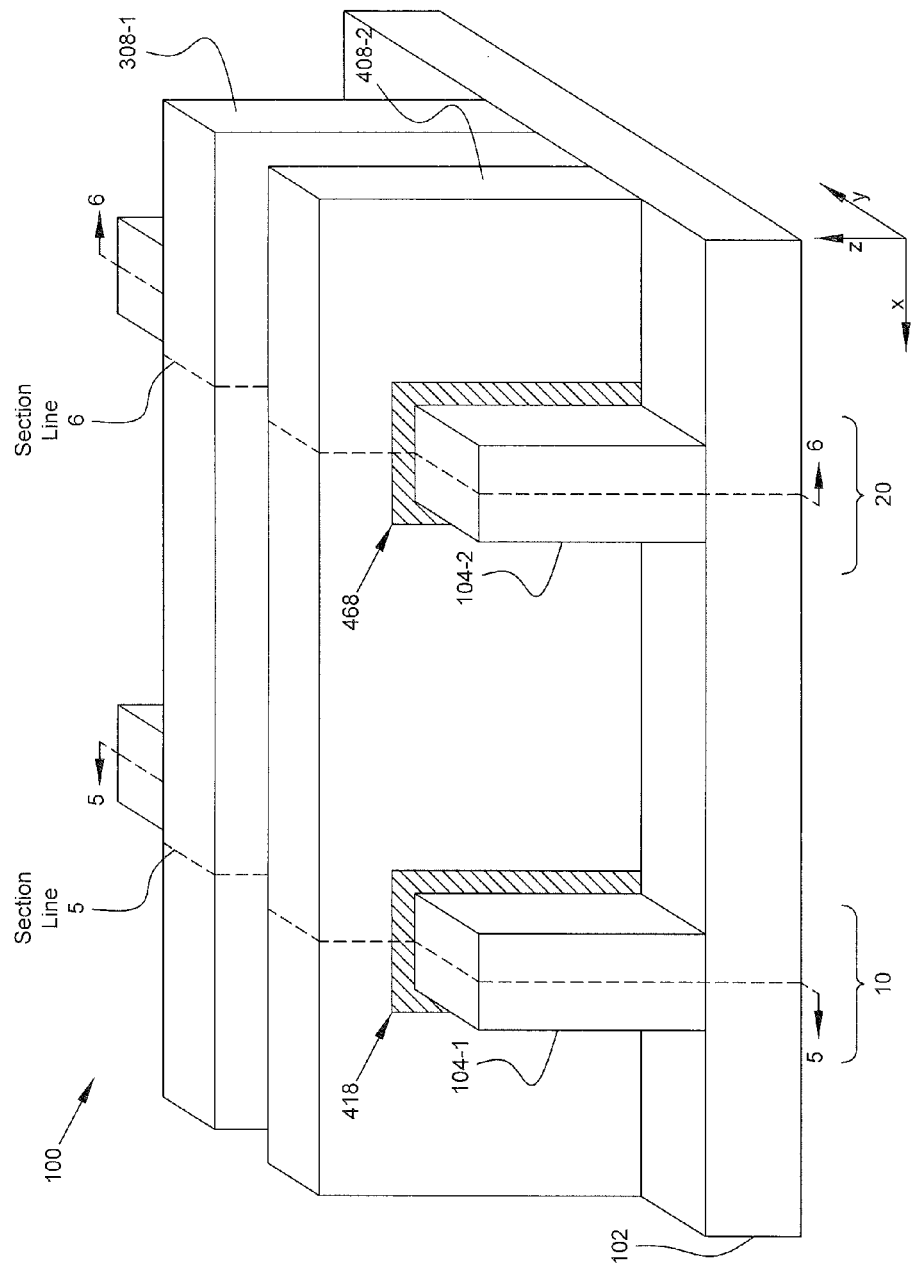
FIG. 4 illustrates an isometric view of a multi-gate semiconductor device showing different cross-section directions for FIGS. 5 and 6.

FIG. 4 shows an isometric view of the formation of an multigate device structure and illustrates cross-section directions for FIGS. 5 and 6. In FIG. 4, the multigate device structure includes a part of a wafer 100, which further includes a semiconductor substrate 102. Gate electrode layers 308-1 and 408-2 are deposited in both N region 10 and P region 20 and over semiconductor fin 104-1 and semiconductor fin 104-2. Isolation regions, such as STI regions (not shown) may be formed in or over substrate 102 and between fins 104-1 and 104-2. In some embodiments, gate electrode layer 308-1 may be deposited over channel region 262 (FIG. 2) and channel region 662 (FIG. 6) and gate electrode layer 408-2 may be deposited over channel region 212 (FIG. 2) and channel region 612 (FIG. 6). The gate electrode layers 308-1 and 408-2 may be respectively formed by any suitable method. In some embodiments, gate dielectric layers 318 (468) and 418 (368) may be deposited in both N region 10 and P region 20 and over semiconductor fins 104-1 and 104-2. Gate dielectric layers 318 (418) and 368 (468) may be formed by any suitable method. In the illustrated embodiment, gate electrode layers 308-1 and 408-2 are respectively formed on gate dielectric layers 318 (418) and 368 (468) in both N region 10 and P region 20 and over semiconductor fins 104-1 and 104-2. In another embodiment, gate electrode layer 308-1 and gate dielectric layer 318 (368), and gate electrode layer 408-2 and gate dielectric layer 418 (468), may be patterned to form gate stacks (not shown) over semiconductor fins 104-1 and 104-2.

In some embodiments where channel regions 262, 662 (FIG. 6) are n-type doped, gate electrode layer 408-2 may be formed from any suitable p-type metal. In another embodiment where channel regions 262, 662 (FIG. 6) are p-type doped, gate electrode layer 408-2 may be formed from any suitable n-type metal. In some embodiments, the illustrated multigate device structure includes a NMOS transistor including a first fin portion 104-1, n-type doped channel region 262, gate dielectric layer 418 and p-type metal gate electrode layer 408-2. The illustrated multigate device structure may further include a PMOS transistor including a second fin portion 104-2, n-type doped channel region 662 (FIG. 6), gate dielectric layer 468 and p-type metal gate electrode layer 408-2. In some embodiments, the NMOS transistor and PMOS transistor have respective first and second voltage thresholds (VT). The first VT may be higher than the second VT. For example, the first-VT may be approximately between 0.5 and 0.8V (e.g. 0.45 to 0.85V) such that the NMOS transistor is a high VT transistor. The second VT may be approximately between −0.1 and 0.1V (e.g. −0.15V to 0.15V) such that the PMOS transistor is a low VT transistor. In an exemplary embodiment, the work function difference between a NMOS transistor and a PMOS transistor in the illustrated multigate device structure is less than approximately 200 millielectron volts (meV). (e.g. less than 210 meV). In some embodiments, the work function difference between a NMOS transistor and a PMOS transistor in the illustrated multigate device structure is between approximately 100 meV and 200 meV (e.g. 95-210 meV).

In some embodiments, a photo resist (not shown) may be formed over a selected portion of wafer 100 including portions of fin 104-1 and 104-2 where channel 408-2 is intended to be deposited. A photo resist (not shown) may be formed from any suitable material including, for example, DNQ-novolac or SU-8. A gate dielectric layer 418 (468) may be deposited in both NMOS region 10 and PMOS region 20 and over portions of semiconductor fins 104-1 and 104-2 not covered by the photo resist (not shown). Gate electrode layer 408-1 may be formed on gate dielectric layer 418 (468) in both NMOS region 10 and PMOS region 20 and over semiconductor fins 104-1 and 104-2. The photo resist (not shown) may be removed by any suitable method, including, but not limited to, patterning or etching In some embodiments, a gate dielectric layer 518 (568) may be deposited in both NMOS region 10 and PMOS region 20 and over portions of semiconductor fins 104-1 and 104-2 where electrode layer 508-2 is intended to be formed. Gate electrode layer 508-2 may be formed on gate dielectric layer 468 (518) in both NMOS region 10 and PMOS region 20 and over semiconductor fins 104-1 and 104-2. In another embodiment, a photo resist (not shown) may be formed over the portions of fin 104-1 and 104-2 where channel 408-1 was deposited prior to deposition of dielectric material layer 518 (568) and gate electrode layer 508-2. In another embodiment, a hard resist (not shown), bottom anti-reflective coating (BARC) (not shown) or other suitable method of patterning may be formed. The hard resist may be formed from any suitable material including a nitride or oxynitride.

FIG. 5 is a cross-sectional view of a portion of wafer 100 and portions of fin 104-1 taken along the section line 5 of FIGS. 1, 3 and 4. In the illustrated embodiment, channel region 212 is p-type doped and gate electrode layer 308-1 is formed from any suitable n-type metal. In the illustrated embodiment, channel region 262 is n-type doped, and gate electrode layer 408-2 is formed from any suitable p-type metal. In some embodiments, the illustrated multigate device structure may include a first NMOS transistor including a first fin portion 104-1, p-type doped channel region 212, gate dielectric layer 318 and n-type metal gate electrode layer 308-1. In some embodiments, lightly doped source 514 and drain 516 regions of fin 104-1 may be formed by implantation or any suitable method. In the illustrated embodiment, implantation may be performed to introduce an n-type impurity, for example, arsenic or phosphorous, to form lightly doped source 514 and drain 516 regions. Lightly doped drain (LDD) regions 506 may also be formed close to the top surface of fin 104-1 and along the sidewalls of channel 212 by any suitable method as shown in FIG. 6. Spacers 510 may be formed by any suitable method. Channel 212, lightly doped source 514 and drain 516 regions and LDD regions 506 may be formed from any suitable material including, but not limited to Ge, SiGe or a III-V semiconductor material.

As shown in FIG. 5, the illustrated multigate device structure may further include a second NMOS transistor including a second fin portion 104-1, n-type doped channel region 262, gate dielectric layer 418, p-type metal gate electrode layer 408-2, lightly doped source 564 and drain 566 regions of fin 104-1, spacers 560, and LDD regions 556. In some embodiments, channel regions 212 and 262 are doped at a concentration between approximately $-2e^{18}$ and $1e^{18}$ charge carriers per cubic centimeter (e.g. between $-2.1e^{18}$ and $1.05e^{18}$ charge carriers per cubic centimeter.) In some embodiments, the NMOS transistors have respective first and second voltage thresholds (VT). The second VT may be higher than the first VT. For example, the second-VT may be approximately between 0.5 and 0.8V (e.g. 0.45 to 0.85V) such that the second NMOS transistor is a high VT transistor. The first VT may be approximately between −0.1 and 0.1V (e.g. −0.15V to 0.15V) such that the first NMOS transistor is a low VT transistor. In an exemplary embodiment, the work function difference between the first and second NMOS transistors in the illustrated multigate device structure is less than approximately 200 millielectron volts (meV). (e.g. less than 210 meV).

Figure 7:
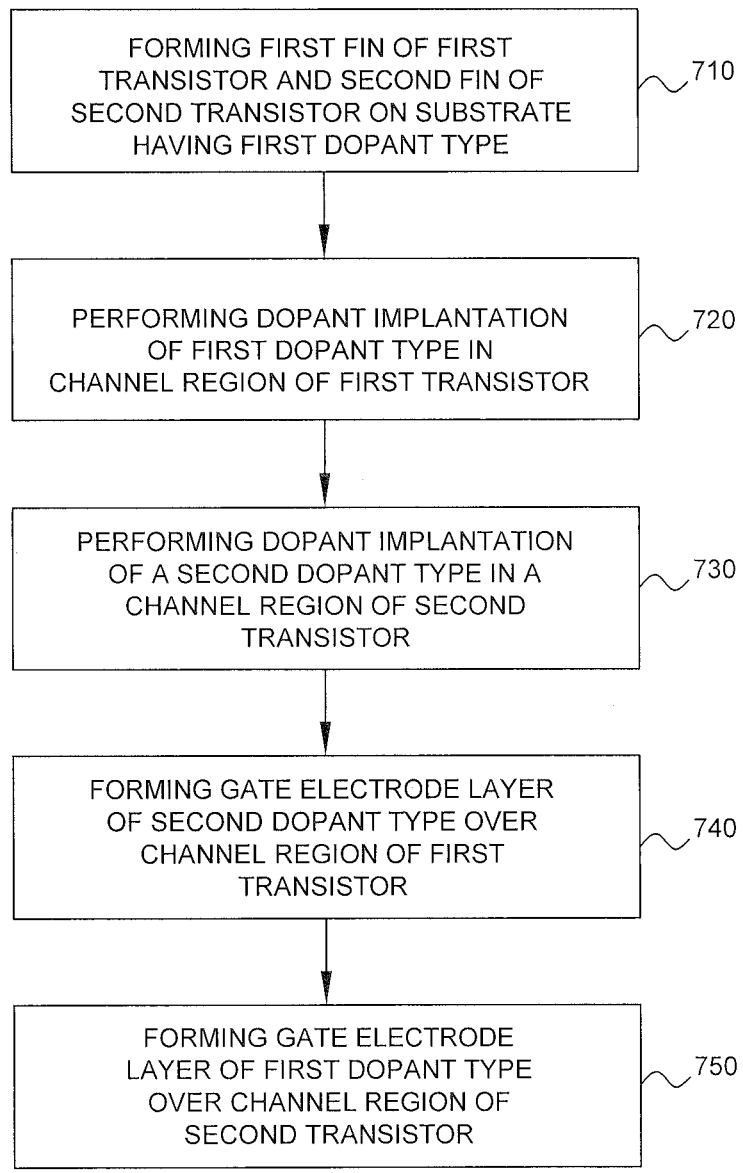
FIG. 7 is a flow chart illustrating a method of forming a multi-gate semiconductor device according to an embodiment of the present disclosure.

FIG. 6 is a cross-sectional view of a portion of wafer 100 and portions of fin 104-2 taken along the section line 6 of FIGS. 3 and 4. The illustrated multigate device structure may include a first PMOS transistor including a first fin portion of fin 104-2, p-type doped channel region 662, gate dielectric layer 468, n-type metal gate electrode layer 408-2, lightly doped source 664 and drain 666 regions of fin 104-2, spacers 660, and LDD regions 656. As shown in FIG. 7, the illustrated multigate device structure may further include a second PMOS transistor including a second fin portion 104-2, p-type doped channel region 612, gate dielectric layer 368, n-type metal gate electrode layer 308-1, lightly doped source 614 and drain 616 regions of fin 104-2, spacers 610 and LDD regions 656. Channel regions 612 and 662 may be doped at concentrations between approximately $-2e^{18}$ and $1e^{18}$ charge carriers per cubic centimeter (e.g. between $-2.1e^{18}$ and $1.05e^{18}$ charge carriers per cubic centimeter.) In some embodiments, the PMOS transistors have respective first and second voltage thresholds (VT) where the first VT is higher than the second VT. In an exemplary embodiment, the work function difference between the first and second PMOS transistors in the illustrated multigate device structure is less than approximately 200 millielectron volts (meV). (e.g. less than 210 meV).

Figure 8:
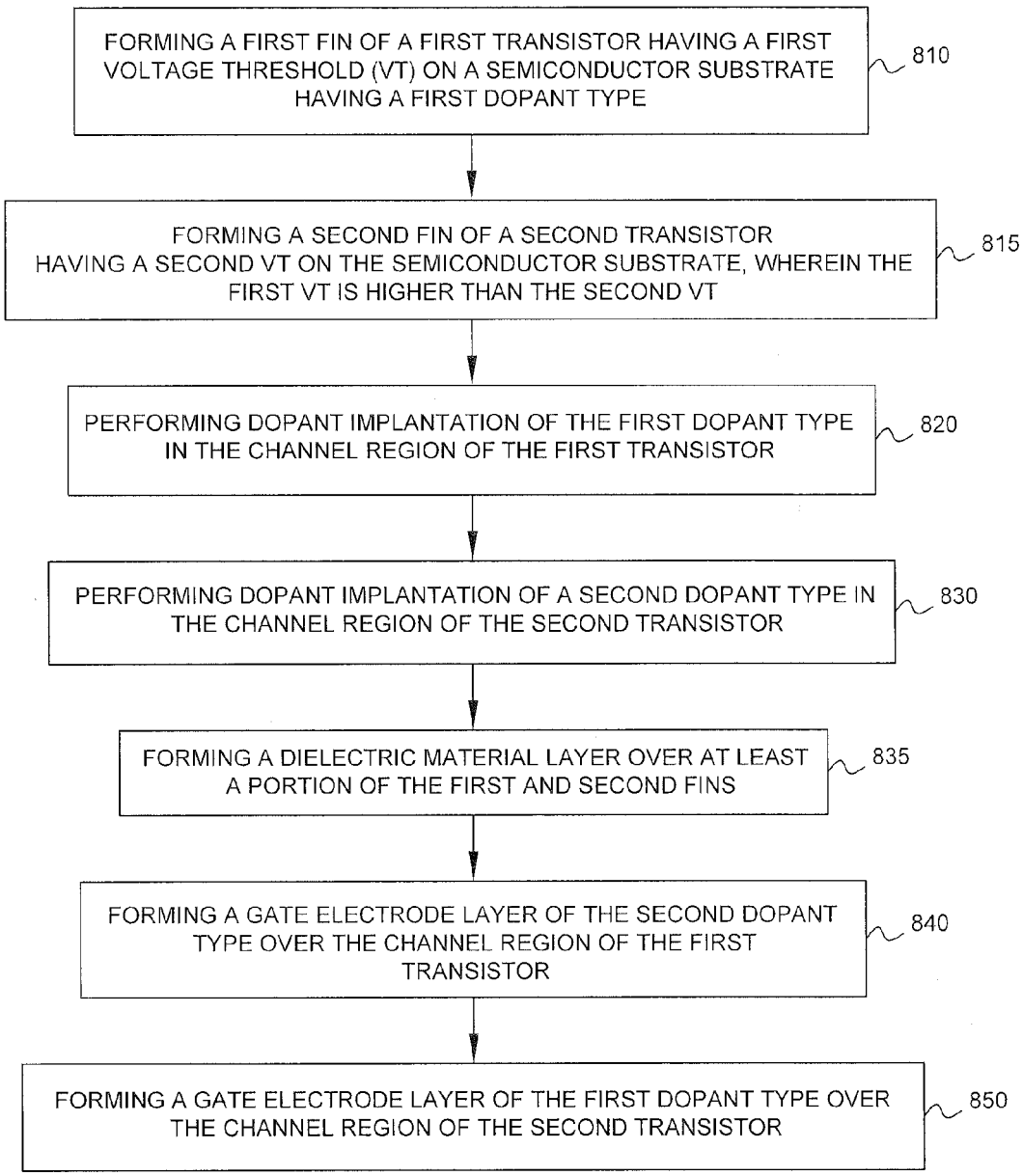
FIG. 8 is a flow chart illustrating a method of forming a multi-gate semiconductor device according to an embodiment of the present disclosure.

FIGS. 7 and 8 are flow charts illustrating methods of forming a multi-gate semiconductor device according to some embodiments of the present disclosure. At step 710 (810, 815), a first semiconductor fin (104-1) of a first transistor and a second semiconductor fin (104-2) of a second transistor are formed on an active region of a semiconductor substrate 102 having a first dopant type 10. The first (104-1) and second (104-2) fins may be formed by any suitable method. In some embodiments, the first transistor may have a first VT and the second transistor may have a second VT. In some embodiments, the first VT is higher than the second VT. In another embodiment, a third semiconductor fin (not shown) of a third transistor and a fourth semiconductor fin (not shown) of a fourth transistor may be formed on semiconductor substrate 102 where semiconductor substrate is of a second dopant type 20. The third transistor may have a VT between the first and second VT. In another embodiment, the fourth transistor has a fourth VT. In some embodiments, the first dopant type may be n-type. At step 720 (820), first type (e.g. n-type) dopants are implanted in a channel region 212 of the first transistor. At step 730 (830), second type dopants (e.g. p-type) are implanted in a channel region 612 of the second transistor. Channel regions 212, 262 may be doped at concentrations between approximately $-2e^{18}$ and $1e^{18}$ charge carriers per cubic centimeter (e.g. between $-2.1e^{18}$ and $1.05e^{18}$ charge carriers per cubic centimeter.) In another embodiment, the doping is reversed such that channel region 212 is p-type doped and channel region 262 is n-type doped.

With reference to FIG. 8, at block 835, a dielectric material layer 318 (418) may be formed over at least a portion of the first (104-1) and second (104-2) fins. In some embodiments, a dielectric material layer 318 may be formed over channel region 212. A dielectric material layer 418 may further be formed over channel region 612. At step 740 (840), a gate electrode layer 308-1 of the second dopant type (e.g. p-type) over the channel region 212 of the first transistor. At step 750 (850), a gate electrode layer of the first dopant type (e.g. n-type) may be formed over the channel region 612 of the second transistor. In another embodiment, second type (e.g. p-type) dopants may be implanted in a channel region (not shown) of the third transistor (not shown) and first type (e.g. n-type) dopants may be implanted in a channel region (not shown) of the fourth transistor. A gate electrode of the first dopant type (e.g. n-type) may be formed over the channel region (not shown) of the third transistor. A gate electrode of the second dopant type (e.g. p-type) may further be formed over the channel region (not shown) of the third transistor. In an exemplary embodiment, the difference between a work function of the first transistor and a work function of the second transistor is less than approximately 200 millielectron volts. (e.g. less than 210 meV). In some embodiments, the difference between a work function of each of the four transistors is less than approximately 200 millielectron volts.

Figure 10:
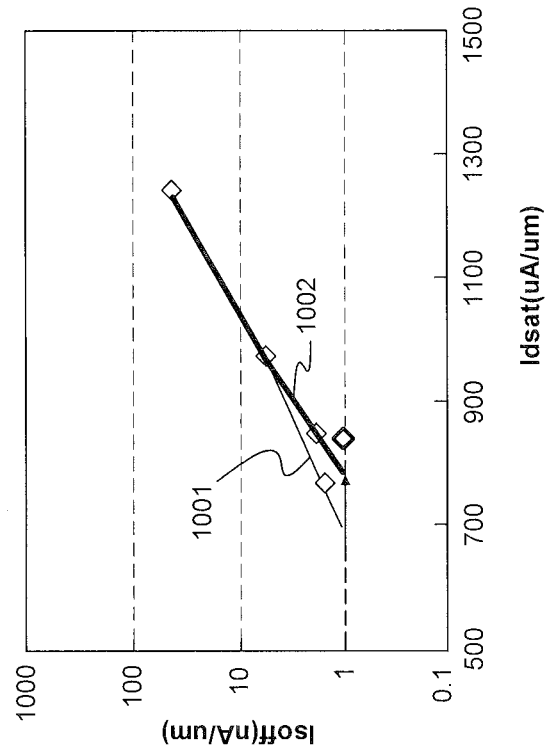
FIG. 10 is a diagram of leakage current as a function of various parameters.
Figure 9:
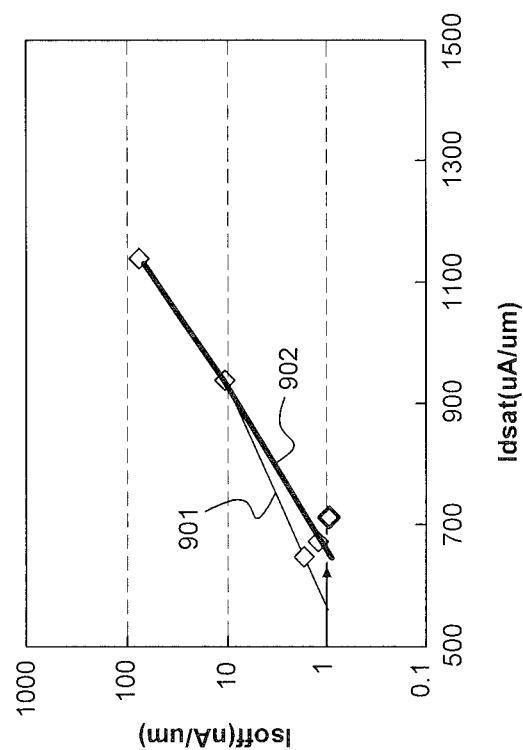
FIG. 9 is a diagram of leakage current as a function of various parameters.
Figure 11:
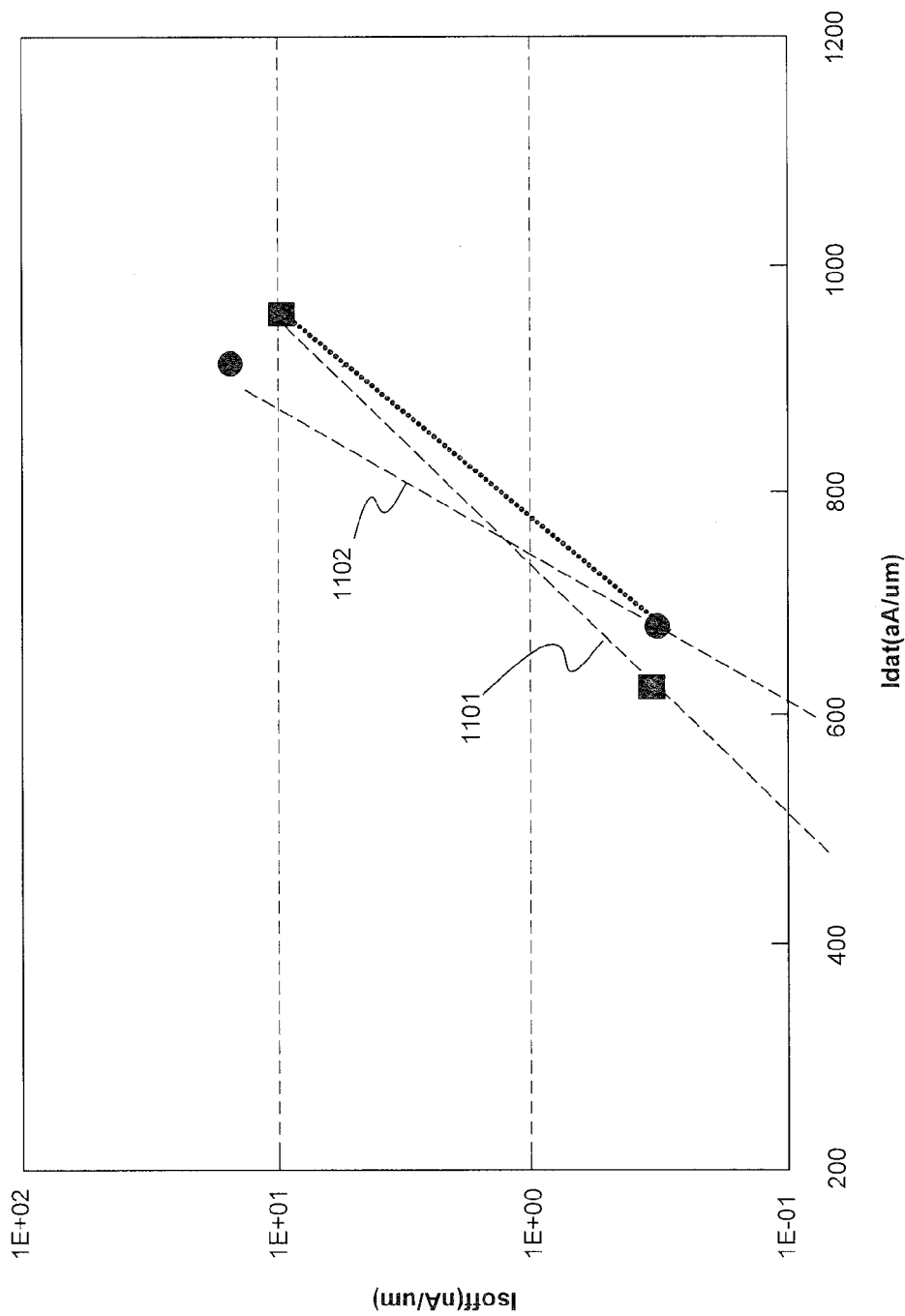
FIG. 11 is a diagram of leakage current as a function of various parameters.

FIGS. 9-11 are based on simulation data which used the conditions described herein. FIGS. 9 and 10 show the leakage current (in nanoangstroms per micrometer nA/μm) as a function of saturation current (in microangstroms per micrometer μA/μm) for NMOS and PMOS FinFET devices respectively.

The Figures show the saturation current enhancement achieved by the optimized selection of metal gate electrode and channel region dopant materials. Curve 901 (1001) illustrates data for transistors in the FinFET devices having n-type metal gate electrodes and having increasing voltage threshold and channel region n-type dopant concentrations from right to left. Curve 902 (1002) shows data for transistors in the FinFET devices having p-type metal gate electrodes as in curve 901 (1001), and having increasing voltage threshold and channel region n-type dopant concentrations from right to left. FIG. 11 shows the leakage current (in nanoangstroms per micrometer nA/μm) as a function of saturation current (in microangstroms per micrometer μA/μm) for a PMOS FinFET device. Curve 1101 illustrates data for transistors in a PMOS FinFET device having p-type metal gate electrodes and having increasing voltage threshold and channel region n-type dopant concentrations from right to left. Curve 1102 shows data for transistors in a PMOS FinFET device having n-type metal gate electrodes as in curve 1101, and having increasing voltage threshold and channel region n-type dopant concentrations from right to left. In all cases, the dopant concentration in the respective transistor channel regions was maintained between approximately $-2e^{18}$ and $1e^{18}$ charge carriers per cubic centimeter and differences in work function were observed to be between 100 and 200 meV.

As shown by the various configurations and embodiments illustrated in FIGS. 1-11, various improved multi-gate semiconductor devices and methods of forming the same have been described.

One embodiment provides a method of forming a multi-gate semiconductor device including forming a first fin of a first transistor and a second fin of a second transistor on a semiconductor substrate having a first dopant type. Dopant implantation of the first dopant type is performed in a channel region of the first transistor. Dopant implantation of a second dopant type is performed in a channel region of the second transistor. The embodiment also includes forming a gate electrode layer of the second dopant type over the channel region of the first transistor and forming a gate electrode layer of the first dopant type over the channel region of the second transistor.

Another embodiment provides a multi-gate semiconductor device including a first fin of a first transistor formed on a semiconductor substrate having a first dopant type. The first transistor has a doped channel region of the first dopant type. The embodiment also includes a second fin of a second transistor formed on the first dopant type semiconductor substrate. The second transistor has a doped channel region of a second dopant type. The embodiment further includes a gate electrode layer of the second dopant type formed over the channel region of the first fin and a gate electrode layer of the first dopant type formed over the channel region of the second fin.

A further embodiment provides a method of forming a multi-gate semiconductor device including forming a first fin of a first transistor having a first voltage threshold (VT) on a semiconductor substrate having a first dopant type. A second fin of a second transistor having a second VT is formed on the semiconductor substrate. In this embodiment, the first VT is higher than the second VT. Dopant implantation of the first dopant type is performed in a channel region of the first transistor. Dopant implantation of a second dopant type is performed in a channel region of the second transistor. The embodiment also includes forming a dielectric material layer over at least a portion of the first and second fins. A gate electrode layer of the second dopant type is formed over the channel region of the first transistor and a gate electrode layer of the first dopant type is formed over the channel region of the second transistor.

While preferred embodiments have been described, it is to be understood that the embodiments described are illustrative only and that the scope of the subject matter is to be accorded a full range of equivalents, many variations and modifications naturally occurring to those of skill in the art from a perusal hereof.

Furthermore, the above examples are illustrative only and are not intended to limit the scope of the disclosure as defined by the appended claims. It will be apparent to those skilled in the art that various modifications and variations can be made in the methods of the present subject matter without departing from the spirit and scope of the disclosure. Thus, it is intended that the claims cover the variations and modifications that may be made by those of ordinary skill in the art.

What we claim is:

1. A method of forming a multi-gate semiconductor device, comprising:
   forming a first fin on a first portion of a semiconductor substrate having a first dopant type;
   performing dopant implantation of the first dopant type in a first channel region of the first fin;
   performing dopant implantation of a second dopant type in a second channel region of the first fin;
   forming a gate electrode layer of the second dopant type over the first channel region of the first fin; and
   forming a gate electrode layer of the first dopant type over the second channel region of the first fin.

2. The method of claim 1, further comprising:
   forming a second fin on a second portion of a semiconductor substrate having a second dopant type;
   performing dopant implantation of the second dopant type in a first channel region of the second fin;
   performing dopant implantation of the first dopant type in a second channel region of the second fin;
   forming a gate electrode layer of the first dopant type over the first channel region of the second fin; and
   forming a gate electrode layer of the second dopant type over the second channel region of the second fin.

3. The method of claim 2, further comprising:
   forming a dielectric material layer over at least a portion of the first and second fins.

4. The method of claim 1, wherein the first dopant type is N-type and the second dopant type is P-type.

5. The method of claim 4, wherein the device has first and second voltage thresholds (VT) at the first channel region and the second channel region formed in the first fin respectively, and wherein the first VT is higher than the second VT.

6. The method of claim 2, wherein first and second channel regions having respective third and fourth VTs are formed in the second fin, and wherein the third VT is lower than the fourth VT.

7. The method of claim 5, further comprising:
   patterning a photoresist over the p-type channel region having the lower VT;
   then depositing the p-type gate electrode layer over the n-type channel region having the higher VT;
   then removing the photoresist from over the p-type channel region; and
   then depositing the n-type gate electrode layer over the p-type channel region.

8. The method of claim 5, wherein the difference between a work function at the first channel region and a work function at the second channel region is approximately 200 millielectron volts or less.

9. The method of claim 5, wherein the first and second channel regions of the first fin are doped at concentrations between −2e18 and 1e18 charge carriers per cubic centimeter.

10. A method of forming a multi-gate semiconductor device, comprising:
    forming a first fin;
    performing dopant implantation of the first dopant type in a first channel region of the first fin;
    performing dopant implantation of a second dopant type in a second channel region of the first fin;
    forming a dielectric material layer over at least a portion of the first and second channel regions of the fin;
    forming a gate electrode layer of the second dopant type over the first channel region of the first fin; and
    forming a gate electrode layer of the first dopant type over the second channel region of the first fin;
    wherein the device has a first voltage threshold (VT) at the first channel region and a second VT higher than the first VT at the second channel region.

11. The method of claim 5, wherein the first VT is approximately 0.1V or more and is approximately 0.1V higher than the second VT.

12. The method of claim 11, wherein the first VT is between approximately 0.5 and 0.8V.

13. The method of claim 12, wherein the second VT is between approximately −0.1 and 0.1V.

14. The method of claim 1, wherein the first dopant type is P-type and the second dopant type is N-type.

15. The method of claim 8, wherein the difference between a work function at the first channel region and a work function at the second channel region is between approximately 100 and 200 millielectron volts.

16. The method of claim 10, wherein the difference between a work function of the first and second channel regions is approximately 200 millielectron volts or less.

17. The method of claim 10, wherein the first VT is approximately 0.1V or more, and wherein the difference between the first VT and the second VT is approximately 0.1V or more.

18. The method of claim 10, wherein the first dopant type is N-type and the second dopant type is P-type.

19. The method of claim 18, wherein the first and second channel regions are doped at concentrations between −2e18 and 1e18 charge carriers per cubic centimeter.

20. A method of forming a multi-gate semiconductor device, comprising:
    forming a first fin on a first portion of a semiconductor substrate having a first dopant type;
    forming a second fin on a second portion of the semiconductor substrate having a second dopant type;
    performing dopant implantation first dopant type in a respective first channel region of the first and second fins;
    performing dopant implantation of a second dopant type in a respective second channel region of the first and second fins;
    forming a dielectric material layer over at least a portion of the respective first and second channel regions of the first and second fins;
    forming a gate electrode layer of the second dopant type over the respective first channel regions of the first and second fins;
    forming a gate electrode layer of the first dopant type over the respective second channel regions of the first and second fins;
    wherein the device has a respective first voltage threshold (VT) at the respective first channel regions of the first and second fins;
    wherein the device has a respective second VT at the respective second channel regions of the first and second fins, and wherein the respective first VT is higher than the respective second VT;
    and wherein the respective difference between work functions at the respective first and second channel regions of the first and second fins is approximately 200 millielectron volts or less.

* * * * *